United States Patent [19]

Iyer

[11] Patent Number: 5,382,550
[45] Date of Patent: Jan. 17, 1995

[54] METHOD OF DEPOSITING SIO$_2$ ON A SEMICONDUCTOR SUBSTRATE

[75] Inventor: Ravi Iyer, Boise, Id.

[73] Assignee: Micron Semiconductor, Inc., Boise, Id.

[21] Appl. No.: 103,392

[22] Filed: Aug. 5, 1993

[51] Int. Cl.$^6$ .................................. H01L 21/02
[52] U.S. Cl. .................................. 437/235; 437/238; 437/240; 437/236; 437/941; 148/DIG. 118
[58] Field of Search .............. 437/238, 240, 235, 236, 437/941; 148/118

[56] References Cited

U.S. PATENT DOCUMENTS

| | | | |
|---|---|---|---|
| 4,034,130 | 7/1977 | Briska et al. | 437/238 |
| 4,791,005 | 12/1988 | Becker et al. | 437/236 |
| 4,845,054 | 7/1989 | Mitchener | 437/238 |
| 4,877,641 | 10/1989 | Dory | 437/238 |
| 5,166,101 | 11/1992 | Lee et al. | 437/238 |

OTHER PUBLICATIONS

Normandin et al., "Characterization . . . Tetraethylorthosilicate"; Can. J. Phys. 67, pp. 199–206, 1989.
Emesh et al., "Plasma–Enhanced . . . (TEOS)", J. Electrochem Soc., vol. 136, No. 11, pp. 3404–3408, 1989.
John Butler, et al., "Electrical Characterization of Doped and Undoped PECVD Teos Oxides", *A Poster Presented at VMIC*, Jun. 1990, 7 total pages.
John Butler, et al., "Electrical Characterization of Doped and Undoped PECVD Teos Oxides," *VMIC Conference*, Jun. 12–13, 1990, pp. 387–389.
Han-Bin K. Liang, et al., "A Comparison of PECVD Oxide and Furnace CVD Oxide as the Trench Spacer Oxide in Deep Trench Isolation", Abstract No. 570, *Extended Abstracts, 180th Electrochemical Society Meeting*, vol. 91-2, Fall 1991, 1 page.

Primary Examiner—Brian E. Hearn
Assistant Examiner—Trung Dang
Attorney, Agent, or Firm—Wells, St. John, Roberts, Gregory & Matkin

[57] ABSTRACT

A deposition method of reducing fixed charge in a layer of silicon dioxide includes: a) providing a gaseous organosilicon compound to a chemical vapor deposition reactor having a semiconductor wafer positioned therein; b) providing an oxidizing gas to the reactor for reaction with the organosilicon compound; c) feeding a gaseous hydrogen containing source to the reactor; and d) reacting the organosilicon compound, oxidizing gas and gaseous hydrogen containing source to deposit a layer of silicon dioxide on the wafer, the hydrogen containing source gas effectively reacting with the organosilicon compound to produce reduced fixed charge in the deposited silicon dioxide layer over that which would be present if no hydrogen containing source gas were fed to the reactor under otherwise identical reacting conditions. Another method of depositing a layer of silicon dioxide on a semiconductor wafer comprises: a) providing a gaseous organosilicon compound to a chemical vapor deposition reactor having a semiconductor wafer positioned therein; and b) providing an oxidizing gas to the reactor, and reacting the oxidizing gas with the gaseous organosilicon compound in the reactor to deposit a layer of silicon dioxide on the wafer, the oxidizing gas comprising a compound having an N—O bond.

14 Claims, 1 Drawing Sheet

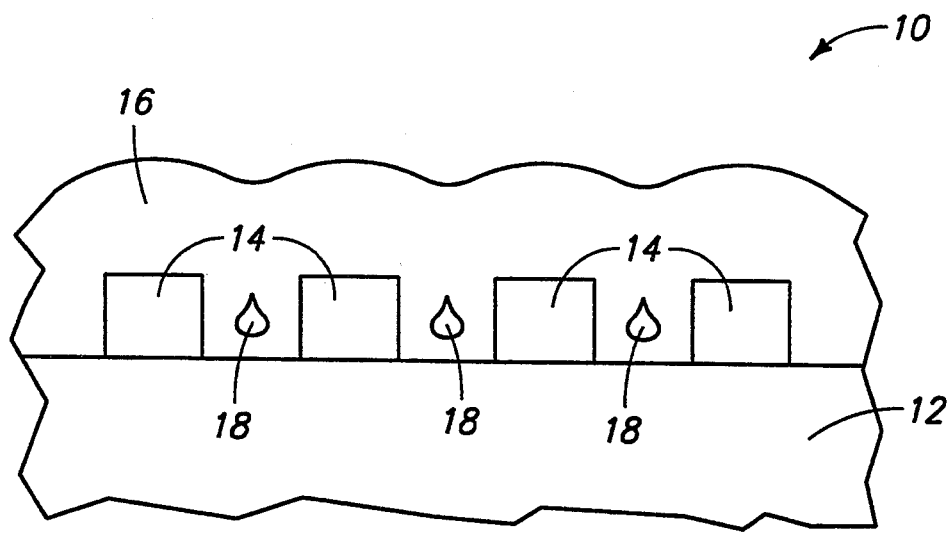
_Fig 1_
_PRIOR ART_
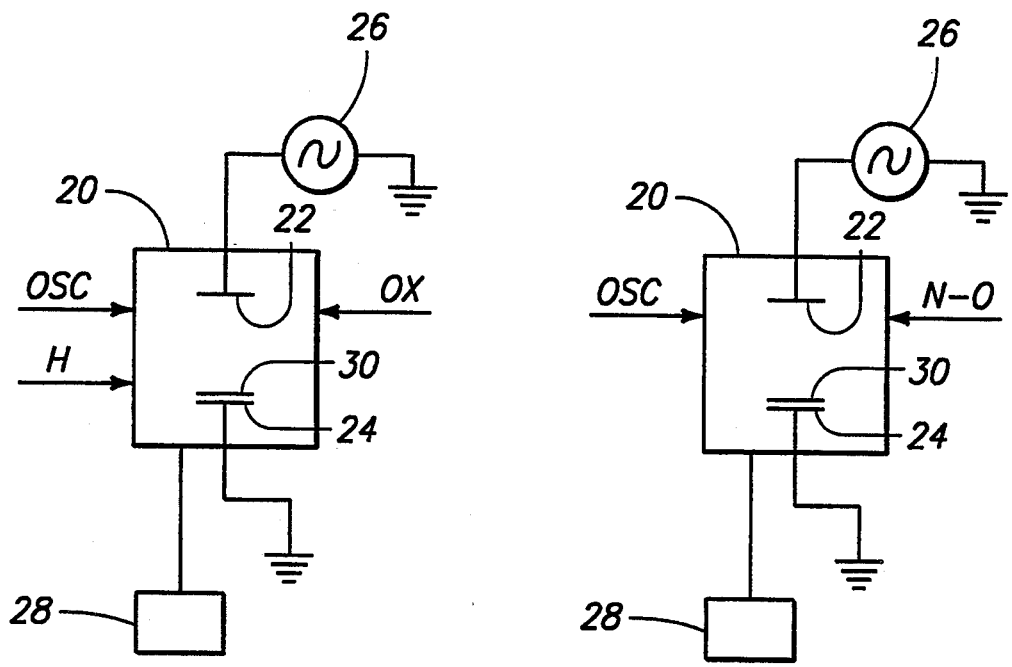
_Fig 2_              _Fig 3_

METHOD OF DEPOSITING SIO₂ ON A SEMICONDUCTOR SUBSTRATE

TECHNICAL FIELD

This invention relates generally to chemical vapor deposition (CVD) methods of depositing silicon dioxide atop a semiconductor substrate utilizing organosilicon compounds in combination with an oxidizing gas.

BACKGROUND OF THE INVENTION

Chemical vapor deposition is defined as the formation of a non-volatile solid film on a substrate by the reaction of vapor phase reactants that contain desired components. The gases are introduced into a reactor vessel, and decompose and react at a heated surface on the wafer to form the desired film.

One material commonly chemical vapor deposited is silicon dioxide films. Such is used as an insulating layer between polysilicon and metal layers, between metal layers and multilevel metal systems, as getters, as diffusion sources, as diffusion and implantation masks, as capping layers to prevent out diffusion, and as final passivation layers. In general, the deposited oxide films desirably exhibit uniform thickness and composition, low particulate and chemical contamination, good adhesion to the substrate, low stress to prevent cracking, good integrity for high dielectric breakdown, conformal step coverage for multilayer systems, low pin hole density, and high throughput for manufacturing.

CVD silicon dioxide is an amorphous structure of $SiO_4$ tetrahedra with an empirical formula $SiO_2$. Depending on the deposition conditions, CVD silicon dioxide may have lower density and slightly different stoichiometry from thermally grown silicon dioxide, causing changes in mechanical and electrical film properties (such as index of refraction, etch rate, stress, dielectric constant, and high electric-field breakdown strength). Deposition at high temperatures, or use of a separate high temperature post-deposition anneal step, can make the properties of CVD $SiO_2$ films approach those of thermal oxide. Properties of the finished film can be modified by doping of the deposited layer with compounds such as boron and/or phosphorus.

Interfaces between a deposited $SiO_2$ layer and silicon create challenges for the semiconductor processor in circuit fabrication. Such interfaces contain various charges and traps which have profound effects on the properties of the electronic components fabricated in the underlying silicon. There are generally four types of charges that exist in the oxide near the $Si/SiO_2$ interface: a) interface trap charge; b) fixed oxide charge; c) mobile ionic charge; and d) bulk oxide trapped charge. One aspect of this invention is specifically directed to reduction of fixed oxide charge. Such is typically located within 35 Angstroms of the $Si/SiO_2$ interface, in the so-called "transition region" between silicon and $SiO_2$. The fixed charge centers are predominantly positive, although some negative compensating senders may also be present. The fixed charge is considered to be a sheet of charge at the $Si/SiO_2$ interface, and is expressed as the number of charges per unit area ($\#/cm^2$).

CVD $SiO_2$ processes using organosilicon compounds as precursors have been plagued with creation of excessive fixed charge in the oxide leading to deleterious effects in the underlying devices. In addition, the fixed charge increases almost ten-fold in these films when they are subjected to a high temperature anneal, such as for reflow purposes. Typical methods for reducing fixed charge use ion implantation to control the device threshold voltage, $V_t$, which is the device parameter most impacted by the fixed oxide charge quantity. It would be desirable to provide CVD $SiO_2$ processes which minimize resultant fixed charge.

Another challenge in chemical vapor deposition of $SiO_2$ is in achieving sufficient gap-fill between adjacent conductive runners. Such is also commonly referred to as step coverage where elevation differences occur within the substrate. The problem is illustrated with reference to FIG. 1. Such depicts a semiconductor wafer fragment 10 comprised of a bulk substrate 12, a plurality of conductive metal runners 14, and an overlying deposited layer 16 of CVD $SiO_2$. Such deposition undesirably produces what is commonly referred to as the "bread-loafing effect" between adjacent runners, which results in voids or keyholes 18 between adjacent runners. It is desirable to achieve complete filling between metal runners such that no voids are present.

BRIEF DESCRIPTION OF THE DRAWINGS

Preferred embodiments of the invention are described below with reference to the following accompanying drawings.

FIG. 1 is a diagrammatic sectional view of a semiconductor wafer fragment processed in accordance with prior art methods, and is discussed in the "Background" section above.

FIG. 2 is a diagrammatic representation of a system usable in accordance with the invention.

FIG. 3 is a diagrammatic representation of an alternate system usable in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a deposition method of reducing fixed charge in a layer of silicon dioxide comprises the following steps:

providing a gaseous organosilicon compound to a chemical vapor deposition reactor having a semiconductor wafer positioned therein;

providing an oxidizing gas to the reactor for reaction with the organosilicon compound;

feeding a gaseous hydrogen containing source to the reactor; and reacting the organosilicon compound, oxidizing gas and gaseous hydrogen containing source to deposit a layer of silicon dioxide on the wafer, the hydrogen containing source gas effectively reacting with the organosilicon compound to produce reduced fixed charge in the deposited silicon dioxide layer over that which would be present if no hydrogen containing source gas were fed to the reactor under otherwise identical reacting conditions.

In accordance with another aspect of the invention, a method of depositing a layer of silicon dioxide on a semiconductor wafer comprises the following steps:

providing a gaseous organosilicon compound to a chemical vapor deposition reactor having a semiconductor wafer positioned therein; and providing an oxidizing gas to the reactor, and reacting the oxidizing gas with the gaseous organosilicon compound in the reactor to deposit a layer of silicon dioxide on the wafer, the oxidizing gas comprising a compound having an N—O bond.

More specifically and with reference to the figures, FIG. 2 schematically illustrates a deposition system and method in accordance with an aspect of the invention. In a preferred embodiment, such comprises a plasma enhanced chemical vapor deposition reactor chamber 20 comprised of a pair of electrodes 22 and 24. Electrode 24 is connected directly to ground, while electrode 22 is connected to an RF power source 26 for inducing a plasma state in the reactant gases injected into chamber 20. A pump 28 is utilized to evacuate and generate vacuum pressure within deposition chamber 20. A semiconductor wafer 30, atop which a layer of $SiO_2$ is to be deposited, is positioned within chamber 20 atop electrode 24.

A gaseous organosilicon compound is provided to reactor chamber 20 via some source line, such as the source line designated "OSC". An oxidizing gas is also fed to reactor chamber 20, via a line designated "OX", for reaction with the organosilicon compound. A gaseous hydrogen containing source is fed to reactor chamber 20 via a line designated "H".

Within reactor chamber 20, power is applied and temperature and pressure provided to react the organosilicon compound, oxidizing gas and gaseous hydrogen containing source to deposit a layer of silicon dioxide on the wafer. The hydrogen containing source gas effectively reacts with the organosilicon compound to produce reduced fixed charge in the deposited silicon dioxide layer over that which would be present if no hydrogen containing source gas were fed to the reactor under otherwise identical reacting conditions.

The organosilicon compound preferably comprises tetraethylorthosilicate (TEOS). By way of example only, an alternate organosilicon compound would include ditertiary butyl silane. The oxidizing gas preferably comprises an inorganic compound having an N—O bond. Examples include NO, $N_2O$ and $NO_2$, or mixtures thereof either alone or combined with other oxidizing gases. The invention was reduced to practice using an oxidizing gas consisting essentially of $N_2O$. By way of example only, an alternate oxidizing gas would be $O_2$. Example gaseous hydrogen containing sources include $H_2$ and $SiH_4$.

Fixed charge incorporation into a deposited $SiO_2$ layer is postulated to be impacted in part by carbon left behind in the deposited film resulting from the reaction of TEOS. Providing a gaseous hydrogen containing source in the above-discovered manner is believed to provide a reactant hydrogen containing source for combining with dissociated elemental carbon, carbon compounds and carbon radicals emanating from the TEOS. Such produces hydrocarbons and other gaseous organic compounds which are expelled from the wafer, thus minimizing carbon incorporation into the resultant $SiO_2$ layer.

The invention further contemplates the provision of conventional gaseous boron or gaseous phosphorus sources to the reactor, such that boro, phospho, or borophosphosilicate glasses are produced.

Organosilicon compounds, such as TEOS, are generally liquid at room temperature and are provided to a deposition reactor by bubbling a gas (typically He) through the liquid TEOS to generate a resultant product which is fed to the reactor. The bubbling gas fed to the liquid TEOS and hydrogen containing source gas fed to the reactor are preferably provided at respective selected flow rates. The ratio of such flow rates of bubbling gas to hydrogen containing source gas are preferably from about 50:1 to 5:1, with about 30:1 to 10:1 being most preferred.

The invention was reduced to practice using an Applied 5000 Plasma Enhanced Chemical Vapor Deposition Reactor, 6 liter, available from Applied Materials of Santa Clara, Calif. A preferred range using such reactor for bubbling helium flow to a liquid TEOS or other organosilicon compound is from about 200 sccm to 2000 sccm. A preferred flow rate for the oxidizing gas, such as $N_2O$, is from about 200 sccm to 2000 sccm. Hydrogen containing source gas flow, such as $SiH_4$, is preferably from about 5 sccm to 200 sccm, and maintaining the above-preferred flow rate ratios. The electrode gap is preferably from about 150 mils to about 250 mils. Applied RF power to the electrodes is preferably from about 200 W–500 W. Reactor chamber 20 is preferably evacuated to a pressure of from about 5 to 10 Torr. Temperature within the reactor is preferably maintained at from 250° to 500° C.

The invention was reduced to practice using an organosilicon source gas of TEOS with helium bubbled therethrough at a rate of 800 sccm; $N_2O$ as the oxidizing gas at a rate of 700 sccm; $SiH_4$ as the hydrogen containing source gas, and at a rate of 50 sccm; an electrode gap maintained at 155 mils; a pressure of 9 Torr; and a temperature of 430° C. The resulting film was annealed at 900° C. to produce reflow. The calculated fixed charge, measured by capacitance voltage, was as low as $2 \times 10^{10}$, which is 100 times lower than a control CVD deposited $SiO_2$ layer having no hydrogen containing source gas feed.

An alternate aspect of the invention is described with reference to FIG. 3. Such illustrates essentially the same chemical vapor deposition reactor chamber 20, with differences being described. In accordance with this aspect of the invention, a gaseous organosilicon compound is fed to reactor chamber 20, again via a line designated as "OSC". An oxidizing gas is fed to the reactor via a line designated "N—O". The oxidizing gas comprises a compound having an N—O bond. The oxidizing gas reacts with the gaseous organosilicon compound in the reactor to deposit a layer of silicon dioxide on the wafer.

The oxidizing gas is preferably inorganic, and selected from the group consisting of NO, $N_2O$, and $NO_2$, mixtures thereof alone or with other oxidizing gases. The organosilicon compound preferably comprises TEOS.

It has been discovered that use of such a compound having an N—O bond as the oxidizing gases produces a much more directional deposition that is thicker on the flat horizontal surfaces than on the vertical surfaces, resulting in growth of $SiO_2$ from the bottom up between conductive runners such that bread-loafing and keyhole void formation is eliminated. Such a process is preferably void of silane gases in the reactor to prevent bread-loafing, which would otherwise occur were a considerable quantity of silane gases present.

The invention further contemplates the provision of conventional gaseous boron or gaseous phosphorus sources to the reactor, such that boro, phospho, or borophosphosilicate glasses are produced.

Where TEOS is used as the organosilicon source, the ratio of the flow rates of the bubbling gas to the oxidizing gas is preferably from about 5:1 to 0.5:1, with from about 2.5:1 to 2:1 being most preferred.

The invention was reduced to practice using an Applied 5000 Plasma Enhanced Chemical Vapor Deposition Reactor, 6 liter, available from Applied Materials of Santa Clara, Calif. A preferred range using such reactor for bubbling helium flow to a liquid TEOS or other organosilicon compound is from about 200 sccm to 2000 sccm. A preferred flow rate for the oxidizing gas, such as $N_2O$, is from about 100 sccm to 1000 sccm. The electrode gap is preferably from about 150 mils to about 250 mils. Applied RF power to the electrodes is preferably from about 200 W–500 W. Reactor chamber 20 is preferably evacuated to a pressure of from about 5 to 10 Torr. Temperature within the reactor is preferably maintained at from 250° to 500° C.

The invention was reduced to practice using an organosilicon source gas of TEOS with helium bubbled therethrough at a rate of 1000 sccm; $N_2O$ as the oxidizing gas at a rate of 500 sccm; an electrode gap maintained at 155 mils; a pressure of 9 Torr; and a temperature of 390° C. The resulting film was annealed in a reflow step at 900° C.

The process described immediately above effectively grows columnar-like structures of $SiO_2$ between adjacent runners such that keyhole formation is completely eliminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A deposition method of reducing fixed charge in a layer of silicon dioxide comprising the following steps:
   providing a gaseous organosilicon compound to a chemical vapor deposition reactor having a semiconductor wafer positioned therein;
   providing an oxidizing gas to the reactor for reaction with the organosilicon compound;
   feeding a gaseous hydrogen containing source to the reactor; and
   reacting the organosilicon compound, oxidizing gas and gaseous hydrogen containing source to deposit a layer of silicon dioxide on the wafer, wherein the hydrogen containing source gas produces hydrogen radicals that are effectively reacting with the organosilicon compound to produce reduced fixed charge in the deposited silicon dioxide layer over that which would be present if no hydrogen containing source gas were fed to the reactor under otherwise identical reacting conditions.

2. The deposition method of reducing fixed charge in a layer of silicon dioxide of claim 1 wherein the oxidizing gas comprises an inorganic compound having an N—O bond.

3. The deposition method of reducing fixed charge in a layer of silicon dioxide of claim 2 wherein the oxidizing gas is selected from the group consisting of NO, $N_2O$ and $NO_2$, or mixtures thereof.

4. The deposition method of reducing fixed charge in a layer of silicon dioxide of claim 1 wherein the oxidizing gas consists essentially of $N_2O$.

5. The deposition method of reducing fixed charge in a layer of silicon dioxide of claim 1 wherein the organosilicon compound comprises TEOS.

6. The deposition method of reducing fixed charge in a layer of silicon dioxide of claim 1 wherein the organosilicon compound comprises ditertiary butyl silane.

7. The deposition method of reducing fixed charge in a layer of silicon dioxide of claim 1 wherein the gaseous hydrogen containing source comprises $H_2$.

8. The deposition method of reducing fixed charge in a layer of silicon dioxide of claim 1 wherein the gaseous hydrogen containing source comprises $SiH_4$.

9. The deposition method of reducing fixed charge in a layer of silicon dioxide of claim 1 further comprising providing a gaseous boron or gaseous phosphorus source to the reactor, and reacting such gaseous boron or gaseous phosphorus to dope the deposited $SiO_2$ layer with at least one of boron or phosphorus.

10. The deposition method of reducing fixed charge in a layer of silicon dioxide of claim 1 wherein the organosilicon compound comprises TEOS, and the oxidizing gas comprises an inorganic compound having an N—O bond.

11. The deposition method of reducing fixed charge in a layer of silicon dioxide of claim 1 wherein the organosilicon compound comprises TEOS, and the oxidizing gas is selected from the group consisting of NO, $N_2O$ and $NO_2$, or mixtures thereof.

12. The deposition method of reducing fixed charge in a layer of silicon dioxide of claim 1 wherein the organosilicon compound comprises TEOS, the gaseous hydrogen containing source comprises $SiH_4$, and the oxidizing gas comprises an inorganic compound having an N—O bond.

13. The deposition method of reducing fixed charge in a layer of silicon dioxide of claim 1 wherein the organosilicon compound comprises TEOS generated by bubbling a gas through liquid TEOS to generate a resultant product which is fed to the reactor, the bubbling gas being fed to the liquid TEOS at a selected volumetric flow rate, the hydrogen containing source gas being fed to the reactor at a selected flow rate, the ratio of the flow rates of bubbling gas to hydrogen containing source gas being from about 50:1 to 5:1.

14. The deposition method of reducing fixed charge in a layer of silicon dioxide of claim 1 wherein the organosilicon compound comprises TEOS generated by bubbling a gas through liquid TEOS to generate a resultant product which is fed to the reactor, the bubbling gas being fed to the liquid TEOS at a selected volumetric flow rate, the hydrogen containing source gas being fed to the reactor at a selected flow rate, the ratio of the flow rates of bubbling gas to hydrogen containing source gas being from about 30:1 to 10:1.

* * * * *